US007613579B2

(12) United States Patent
Haddad et al.

(10) Patent No.: US 7,613,579 B2
(45) Date of Patent: Nov. 3, 2009

(54) GENERALIZED HARMONICITY INDICATOR

(75) Inventors: Darren Haddad, Frankfort, NY (US); Andrew J. Noga, Rome, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 154 days.

(21) Appl. No.: 11/998,990

(22) Filed: Nov. 8, 2007

(65) Prior Publication Data

US 2008/0147341 A1 Jun. 19, 2008

Related U.S. Application Data

(60) Provisional application No. 60/879,210, filed on Dec. 15, 2006.

(51) Int. Cl.
*G01R 13/00* (2006.01)

(52) U.S. Cl. ........................................ 702/66; 702/189

(58) Field of Classification Search .................... 702/66
See application file for complete search history.

(56) References Cited

U.S. PATENT DOCUMENTS

2003/0236663 A1* 12/2003 Dimitrova et al. ........... 704/245
2007/0055508 A1* 3/2007 Zhao et al. .................. 704/226

* cited by examiner

*Primary Examiner*—Bryan Bui
*Assistant Examiner*—Jonathan Teixeira Moffat
(74) *Attorney, Agent, or Firm*—Joseph A. Mancini

(57) ABSTRACT

The invention disclosed herein provides a method and apparatus for analyzing periodic signals so as to determine the degree of harmonicity in real time. Harmonicity estimates are generated for each segment of a signal without the need to process subsequent segments. Harmonicity estimates can be generated in the absence of a fundamental frequency component. The invention has utility in the audio/speech domain for automated speaker identification.

16 Claims, 3 Drawing Sheets

Fundamental estimation evaluation for male speech (top) and female speech (bottom).

| Method | Unvoiced in error (%) | Voiced in error (%) | Gross high errors (%) | Gross low errors (%) | Absolute deviation (Hz) mean | Absolute deviation (Hz) p.s.d. |
|---|---|---|---|---|---|---|
| SRPD | 4.05 | 15.78 | 0.62 | 2.01 | 1.78 | 2.46 |
| eSRPD | 4.63 | 12.07 | 0.90 | 0.56 | 1.40 | 1.74 |
| GHI | 2.88 | 12.08 | 0.96 | 1.07 | 1.67 | 2.16 |
| SRPD | 2.35 | 12.16 | 0.39 | 5.56 | 4.14 | 5.51 |
| eSRPD | 2.73 | 9.13 | 0.43 | 0.23 | 4.17 | 5.13 |
| GHI | 0.89 | 9.06 | 1.09 | 0.22 | 3.02 | 3.91 |

Figure 3

GENERALIZED HARMONICITY INDICATOR

PRIORITY CLAIM UNDER 35 U.S.C. §119(e)

This patent application claims the priority benefit of the filing date of a provisional application Ser. No. 60/879,210, filed in the United States Patent and Trademark Office on Dec. 15, 2006.

STATEMENT OF GOVERNMENT INTEREST

The invention described herein may be manufactured and used by or for the Government for governmental purposes without the payment of any royalty thereon.

BACKGROUND OF THE INVENTION

For many audio applications, a process is required to obtain an accurate estimate of the fundamental and harmonics of periodic sections of the audio signal. More generally, any digital version of a periodic signal can potentially have an associated fundamental frequency component, along with harmonics which are frequency components located at integer multiples of the fundamental. In this description, the focus will be on audio applications and speech applications in particular, without loss of generality to applications outside the speech and audio domains.

For speech, tracking and assessment of fundamental and harmonic frequencies can be a key step in accomplishing such tasks as automated speaker identification, speech data compression, pitch alteration and natural sounding time compressions and expansions [1]. Linguists and speech therapists also use such tracking and assessment for prosodic analyses and training [2].

Various methods of fundamental and harmonic frequency tracking have been proposed and developed, but most have been based on other low resolution techniques such as FFT and cepstral analyses [1]. This is as opposed to using super-resolution frequency estimation as provided by the Matrix Pencil (MP) technique [3]. The prior art in the area of super-resolution speech fundamental determination consists of the "super resolution pitch determinator" (SRPD) [4] and the "enhanced super resolution pitch determinator" (eSRPD) [5] methods. Because these prior methods do not explicitly process a spectral representation or decomposition of the input audio signal, they are not considered to be in the same class as the present invention. However, the SRPD and the eSRPD do provide a baseline for comparisons when assessing the performance of the subject invention and will therefore be referred to in the context of performance.

OBJECTS AND SUMMARY OF THE INVENTION

One object of the present invention is to provide a method and apparatus to analyze periodic signals.

Another object of the present invention is to provide a method and apparatus to determine and track fundamental and harmonic frequency components of periodic signals.

Yet another object of the present invention is to provide a method and apparatus to determine the degree of inharmonicity in signals.

The invention disclosed herein provides a method and apparatus for analyzing periodic signals so as to determine the degree of harmonicity in real time. Harmonicity estimates can be are generated for each segment of a signal without the need to process subsequent segments. Harmonicity estimates can be generated in the absence of a fundamental frequency component. The invention has utility in the audio/speech domain for automated speaker identification.

ADVANTAGES AND NEW FEATURES OF THE PRESENT INVENTION

The present invention is computationally efficient in that it consists of a small number of trivial matrix calculations and comparisons.

The process implemented by the present invention is a real-time process in that an output fundamental and harmonic estimate can be generated for each signal segment without the need to wait for future segments to be processed.

The process implemented by the present invention is not confined to any particular super-resolution signal decomposition, but is particularly suited to the MP technique due to the ability to pre-condition the decomposition based on decay or growth rates, frequencies, initial phases and initial amplitudes.

In the present invention, for many situations, a signal decomposition such as provided by the MP technique is already available. Therefore, the computational efficiency of the present invention process can be easily leveraged by these processes.

The process implemented by the present invention allows for super-resolution tracking of the fundamental and harmonics given that the refinement steps leverage the original input frequency component values.

The process implemented by the present invention does not require that a fundamental component actually be present in the original signal, because the fundamental candidates are generated based on the spacing between frequency components.

In the present invention, a variety of outputs are provided including average fundamental, $\alpha_0$, harmonic assessment count, c, refined fundamental and harmonic estimates, all of which can be more useful as a group as opposed to methods that simply yield the fundamental estimate itself.

In the present invention, tracking is enhanced as a result of incorporating the estimates of fundamental and harmonics from the previous signal segment.

In the present invention, because the GHI process uses the super-resolution list, $\vec{F}$, for refinement, the output harmonic estimates, $h_k$, can be used to assess inharmonicity. Inharmonicity occurs when the harmonics are not exact integer multiples of the fundamental, and can be fairly common for example in musical instruments.

Results produced by the present invention are particularly accurate as compared to the prior art.

REFERENCES

[1] B. Gold, N. Morgan, *Speech and Audio Signal Processing*, John Wiley & Sons, Inc., 2000.

[2] X. Sun, "Pitch Determination and Voice Quality Analysis Using Subharmonic-to-Harmonic Ratio," IEEE Conference on Acoustics Speech and Signal Processing, ICASSP'02, 2002.

[3] T. Sarkar, O. Pereira, "Using the Matrix Pencil Method to Estimate the Parameters of a Sum of Complex Exponentials," IEEE Antennas and Propagation Magazine, Vol. 37, No. 1, February 1995.

[4] Y. Medan, E. Yair, D. Chazan, "Super Resolution Pitch Determination of Speech Signals," IEEE Trans. On Signal Processing, ASSP-39(1):40-48, 1991.

[5] P. Bagshaw, S. Hiller, M. Jack, "Enhanced Pitch Tracking and the Processing of F0 Contours for Computer Aided Intonation Teaching," 3rd European Conference on Speech Communication and Technology, EUROSPEECH'93, Berlin, Germany, September 1993.

BRIEF DESCRIPTION OF THE DRAWINGS

FIG. 3 depicts the fundamental estimation evaluation for both male an female speech in the present invention.

DETAILED DESCRIPTION OF THE PREFERRED EMBODIMENT

The purpose of the present invention, a Generalized Harmonicity Indicator (GHI), is to determine, assess and track the fundamental and harmonic frequencies of consecutive time segments of a signal.

Figure 1:
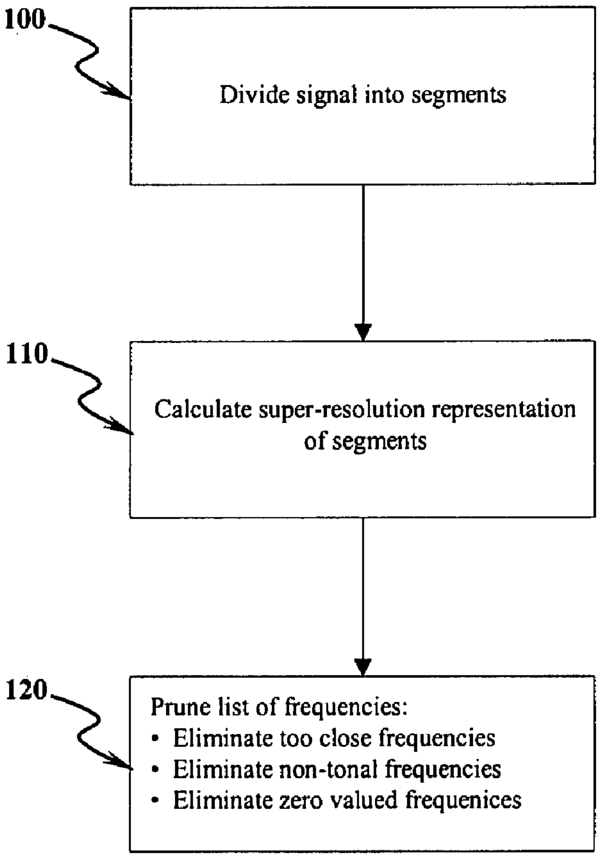
FIG. 1 depicts—a preprocessing step in the present invention.

Referring to FIG. 1, as a pre-processing step to the GHI process, the signal to be analyzed is first divided into consecutive overlapping or non-overlapping segments 100. Segment lengths and overlap percentages are typically chosen to be consistent with the stationarity properties of the signal to be analyzed. In particular, multiple periods should be present in the segment, but the number of periods should not be arbitrarily large otherwise the fundamental and harmonic values may deviate excessively. Also, choosing too many periods can cause the computational complexity of super-resolution techniques to become prohibitive.

For each segment, a second pre-processing step is the calculation of the super-resolution representation of the segment 110, as provided by signal decompositions such as the MP technique. The MP technique is particularly effective at determining the frequency content of the signal, and includes frequency decay rates initial phases and initial amplitudes in the decomposition.

In a third and final pre-processing step, available decay and initial amplitude values are used to prune 120 the original list of frequencies that the super-resolution process provides from the segment being decomposed. Frequencies that are too close to each other within the frequency resolution of the technique are eliminated. Likewise, frequency values that are not tone-like due to non-trivial decay (or growth) values are also eliminated. Any zero valued frequencies that may result are also eliminated. The final pruning is the elimination of frequency values associated with trivial initial amplitudes relative to the number of bits of precision in the representation of the digitized signal. The result is a list of frequency values, $\vec{L}$, which serves as input to the GHI process.

Figure 2:
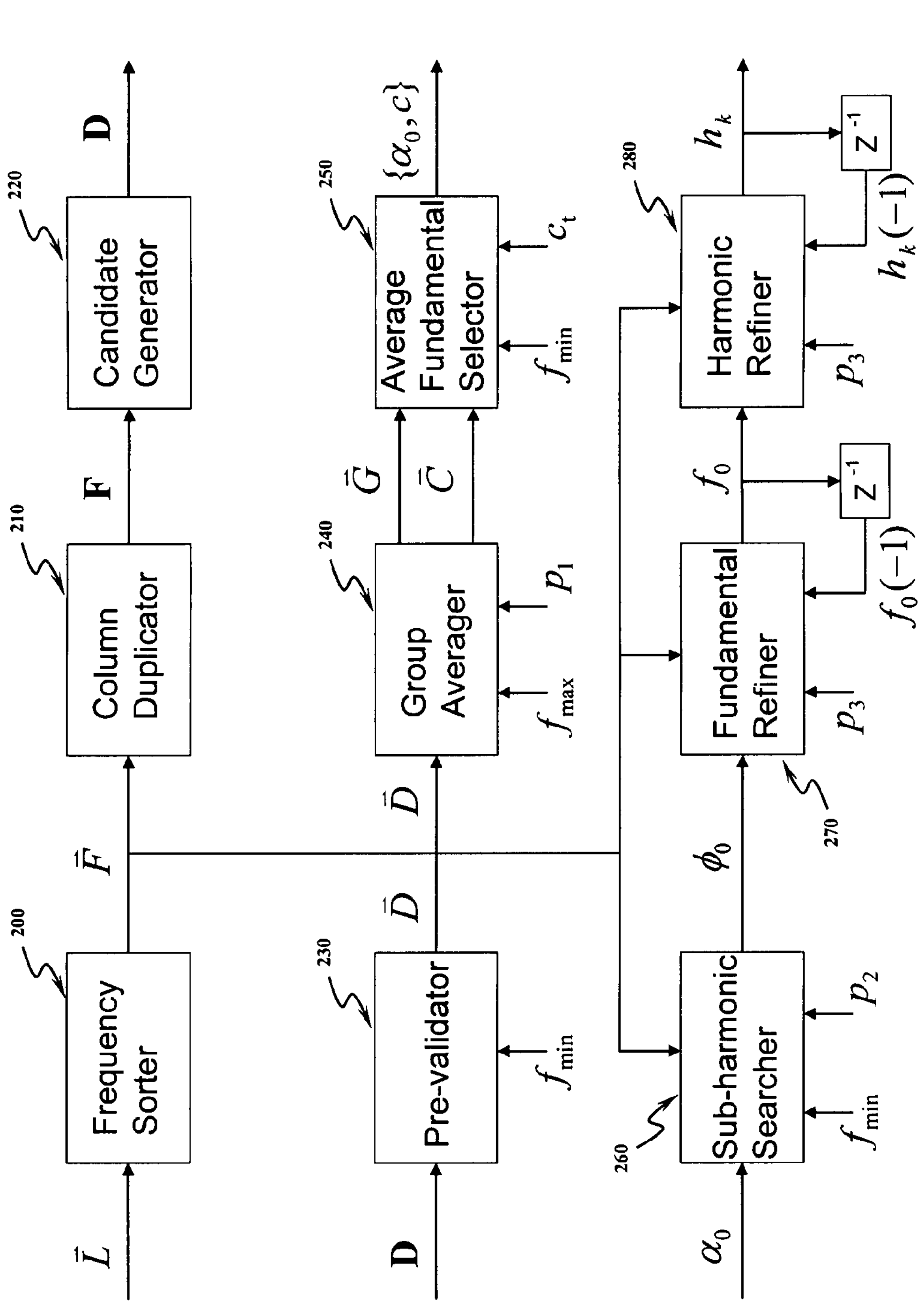
FIG. 2 depicts a block diagram of the process performed by the present invention.

Referring to FIG. 2, the n elements of the n×1 list vector $\vec{L}$ are ordered in the Frequency Sorter 200, for example in ascending order, to form the ordered frequency list vector, $\vec{F}$. The n×1 vector $\vec{F}$ is then input to the Column Duplicator 210, which forms the n×n matrix F by replicating $\vec{F}$ for each column of F. Mathematically, $F=\vec{F}\vec{1}^T$, where $\vec{1}^{T\ is}$ a 1×n dimension row vector, the elements of which are all 1. The frequency matrix F is then input to the Candidate Generator 220, where the n×n matrix of candidate fundamentals, D is formed as $D=\vec{F}-F^T$. When ascending ordering is used for $\vec{F}$, the matrix D can be represented as the sum of an upper triangular matrix and a lower triangular matrix, and will have diagonal elements that are each zero. Thus the elements below the diagonal for the described ascending ordering will be the frequency differences which can be used to determine the fundamental and harmonics in subsequent steps.

The matrix D is input to the Pre-validator 230 which forms a vector $\vec{D}$ whose elements are chosen from the positive elements of D that are greater than some minimum value, $f_{min}>0$. The elements of the m×1 vector $\vec{D}$ are arranged in ascending order and will result in $m \leqq 0.5n^2-0.5n$. The pre-validated candidate fundamental list, $\vec{D}$, is then input to the Group Averager 240, which produces both a vector of averaged groupings of fundamentals, $\vec{G}$, and an associated count vector, $\vec{C}$. To generate the groupings, $\vec{G}$, group boundaries are formed by inspecting the elements of the candidate fundamental list, $\vec{D}$. Starting with the second element of $\vec{D}$, a difference is formed between each current element and the previous element in the vector. If this difference is less than a fraction $p_1$ times the current element, then the element is grouped with the prior element. Otherwise, a new group is started with the current element. The parameter $p_1$ is typically chosen to be 0.1 (10 percent). Because elements are in ascending order, each group represents a distinct positive change in candidate fundamentals. For each defined group, the number of elements in each group are used as the elements of the count vector, $\vec{C}$. Using these counts, groups of candidate fundamentals are averaged to form the corresponding elements of the vector $\vec{G}$. Averages greater than the parameter $f_{max}$ are not allowed, and likewise the corresponding elements of the count vector $\vec{C}$ are eliminated. The group average vector, $\vec{G}$, and the count vector, $\vec{C}$, are both input to the Average Fundamental Selector 250. If after such processing there are no elements in $\vec{G}$, then it is arbitrarily assigned a single element equal to $f_{min}$, and the count vector $\vec{C}$ is assigned a corresponding single element equal to a count threshold, $c_t$. For example, the count threshold for a representative speech pitch estimation application was set to 3. From the group average vector, $\vec{G}$, a subset of elements is chosen which correspond to the largest elements of the count vector, $\vec{C}$, greater than or equal to the count threshold, $c_t$. For the speech pitch estimation example application, the elements corresponding to the 3 largest counts are used. The initial fundamental estimate, $\alpha_0$, is chosen as the minimum of the group averages from the subset. The count, c, is chosen as the largest count. Thus the Average Fundamental Selector 250 is biased away from simply using the largest group average. This results in an enhanced selection process that allows for the possibility that a valid fundamental is not the one associated with the largest count.

The scalar value initial fundamental, $\alpha_0$, and the associated count, c, are input to the Sub-harmonic Searcher 260. The Sub-harmonic Searcher 260 forms the n×1 sub-harmonic candidate vector as $\vec{S}=\vec{F}-0.5\alpha_0\vec{1}$ and uses this vector to determine whether or not $\alpha_0$ should be reduced by a factor of 0.5. Reduction is performed if $0.5\alpha_0$ is greater than $f_{min}$ while at the same time, the minimum of absolute values of the elements of $\vec{S}$ is less than $0.5p_2\alpha_0$. Here, $p_2$ is a fractional parameter that restricts the search space. A typical value for this parameter is 0.1 (10 percent). The resulting output of the Sub-harmonic searcher is designated as $\phi_0$, and represents the fundamental estimate prior to optional refinement processes.

The pre-refined fundamental estimate, $\phi_0$, is input to the Fundamental Refiner 270. A pair of n×1 error vectors are formed as $\vec{E}_{-1}=\vec{F}-f_0(-1)\cdot\vec{1}$ and $\vec{E}=\vec{F}-\phi_0\vec{1}$. Here, $f_0(-1)$ is the refined fundamental estimate from the previous signal segment, and $\vec{F}$ is the ordered list vector from the output of the Frequency Sorter 200. Thus the $z^{-1}$ block represents a unit segment delay. A scalar, $x=p_3 f_0(-1)$, is also calculated and is used to restrain the refinement process. Typical values for the fractional parameter $p_3$ is also 0.1 (10 percent). A comparison is made to determine if the minimum of the absolute values of the elements of $\vec{E}$ is less than the minimum of the absolute values of the elements of $\vec{E}_{-1}$, and is also less than x. If so, $f_0$ is the element of $\vec{F}$ associated with the minimum of the absolute values of the elements of $\vec{E}$. If both of these conditions are not met, then $f_0=\phi_0$ (no refinement is made).

The output of the Fundamental Refiner 270, $f_0$, is input to the final optional step, the Harmonic Refiner 280. This step is identical in form to the Fundamental Refiner 270, and is repeated for all harmonic frequencies of interest. For example a harmonic is formed as the product $\phi_k=kf_0$, where the integer k is greater than 1. A pair of n×1 error vectors are formed as $\vec{E}_{-1}=\vec{F}-h_k(-1)\cdot\vec{1}$ and $\vec{E}=\vec{F}-\phi_k\vec{1}$. Here, $h_k(-1)$ is the refined harmonic estimate from the previous signal segment, and $\vec{F}$ is the ordered list vector from the output of the Frequency Sorter 200. A scalar, $x=p_3 h_h(-1)$, is also calculated and is used to restrain the refinement process. Typical values for the fractional parameter $p_3$ is 0.1 (10 percent). A comparison is made to determine if the minimum of the absolute values of the elements of $\vec{E}$ is less than the minimum of the absolute values of the elements of $\vec{E}$, and is also less than x. If so, $h_k$ is the element of $\vec{F}$ associated with the minimum of the absolute values of the elements of $\vec{E}$. If both of these conditions are not met, then $h_k=\phi_k$ (no refinement is made).

Referring to FIG. 3, are the performance results for the GHI process for the application of speech pitch estimation which in the present context refers to fundamental frequency estimation. The top half of the table refers to results from male speech and the bottom half refers to female speech. The speech database used is as described in [5]. This database includes the recording of laryngeal frequency for each file in the database, which acts as the ground truth for fundamental estimation. A special property of speech is the fact that each segment of an utterance can be classified as either voiced or unvoiced. As implied, the voiced segments of the speech are segments that contain fundamental and harmonic frequency content, whereas unvoiced segments are either silence or fricatives and plosives. These latter segments contain either weak or no fundamentals and harmonics. For the given GHI results, a 50% segment overlap is used with a frame size of 12.8 ms for female speech and 25.6 ms for male speech. Gross errors are those declared voice segments in error by more than 20% higher or lower than the true fundamental.

To properly take into account the voiced/unvoiced classification process, the table includes the percentage of voiced segments in error (voiced classified as unvoiced) and the percentage of unvoiced segments in error (unvoiced classified as voice). This is necessary for a fair comparison because mis-classifying voiced segments can affect important performance metrics, the absolute deviation mean and population standard deviation (p.s.d). For example, a higher voiced in error percentage will cause the mean and p.s.d metrics to improve (become lower) as a result of eliminating weak voiced portions of the signal in the metric calculations. Likewise, higher unvoiced in error percentages will cause the metrics to degrade (become higher) as a result of including unvoiced segments in the calculations. For the GHI results shown, a simple energy-based voice/unvoiced classifier was used based on the MP decomposition of the signal. As can be seen in the table, the performance is commensurate with prior super-resolution techniques.

ALTERNATIVE EMBODIMENTS OF THE PRESENT INVENTION

Simple alternatives to the preferred embodiment are conceivable. With regard to the pre-processing that has been described, one could also pre-condition the input frequency list based on phase and decay groupings. Furthermore, super-resolution techniques other than the MP can be used to generate the original list of input frequencies.

Other alternatives include the specific steps leading to the input to the Group Averager (see FIG. 2, 240). The preferred embodiment described the steps in terms of matrix and vector operations. One skilled in the art could also generate this input without explicit use of matrix mathematics. For example, simple "for loops" and "do loops" used in modern coding techniques can be equally effective and possibly more computationally efficient.

Another possible alteration is to search for other sub-harmonics (such as one-third of the fundamental or one-fourth of the fundamental) in the Sub-harmonic Searcher (see FIG. 2, 260). This would be important for example when certain harmonics of the fundamental are not present in the signal and therefore the difference between harmonics is a non-unity integer multiple of the fundamental. Also, mathematical models for inharmonicity have been developed and can be used to aid in the search when inharmonicity is potentially present.

Finally, one could consider using more than a single delay element on the outputs of the Fundamental Refiner (see FIG. 2, 270) and the Harmonic Refiner (see FIG. 2, 280) to allow for further refinement based on past segments. One could also consider non-real time applications where advance elements would allow for refinements based on both past and future segments.

While the present invention has been described in reference to specific embodiments, in light of the foregoing, it should be understood that all matter contained in the above description or shown in the accompanying drawings is intended to be interpreted as illustrative and not in a limiting sense and that various modifications and variations of the invention may be constructed without departing from the scope of the invention defined by the following claims. Thus, other possible variations and modifications should be appreciated.

What is claimed is:

1. An apparatus for analyzing the harmonicity of periodic signals, comprising:

a means for dividing said signal into consecutive segments;

a means for calculating a super-resolution decomposition of said segments into frequency values, frequency decay rates, and initial amplitudes;

a means for pruning said list of frequencies so as to produce a list vector of frequency values $\vec{L}$ having n elements;

a frequency sorter for ordering the elements of said list vector $\vec{L}$ so as to produce an ordered frequency list vector $\vec{F}$;

a column duplicator for forming a matrix F, having as each column said frequency list vector $\vec{F}$;

a candidate generator for forming a matrix of candidate fundamentals D from said matrix F and said frequency list vector $\vec{F}$ according to $D=\vec{F}-F^T$;

a pre-validator for forming a candidate fundamental list vector $\vec{D}$ whose m elements are chosen from the positive elements of D that are greater than a minimum value;

a group averager for producing both a vector of averaged groupings of fundamentals, $\vec{G}$, and an associated count vector, $\vec{C}$, from said fundamental list vector $\vec{D}$;

an average fundamental selector for processing said vector of averaged groupings of fundamentals, $\vec{G}$, and said associated count vector, $\vec{C}$ so as to produce a count threshold c and an initial fundamental estimate $\alpha_0$;

a sub-harmonic searcher for producing a pre-refined fundamental estimate, $\phi_0$, by computing a sub-harmonic candidate vector $\vec{S}$ from said initial fundamental estimate $\alpha_0$ and said frequency list vector $\vec{F}$ according to $\vec{S}=\vec{F}-0.5\alpha_0\vec{1}$;

a fundamental refiner for producing a refined fundamental estimate, $f_0$, by computing a first error vector $\vec{E}_{-1}$, according to $\vec{E}_{-1}=\vec{F}-f_0(-1)\cdot\vec{1}$ and by computing a second error vector $\vec{E}$ according to $\vec{E}=\vec{F}-\phi_k 1$; and a harmonic refiner for producing a refined harmonic estimate, $h_k$, by recomputing said first error vector $\vec{E}_{-1}$ according to $\vec{E}_{-1}=\vec{F}-h_k(-1)\cdot\vec{1}$ and by recomputing said second error vector $\vec{E}$ according to $\vec{E}=\vec{F}-\phi_k\vec{1}$, where $k=kf_0$, and where the integer k is greater than 1; and where $h_k(-1)$ is the refined harmonic estimate from the previous signal segment.

2. The apparatus of claim 1, wherein said pre-validator further comprising means for choosing the positive elements of D that are greater than $f_{min}>0$; and arranging the elements of vector $\vec{D}$ ascending order so as to result in $m\leqq 0.5n^2-0.5n$.

3. The apparatus of claim 1, wherein said group averager further comprising means for inspecting the elements of said fundamental list vector $\vec{D}$;

beginning with the first element of said fundamental list vector $\vec{D}$, forming a difference between the current element and the previous element;

determining whether said difference is less than a fraction $p_1$ times the current element;

IF said difference is less than said fraction $p_1$ times said current element, THEN grouping said current element with said prior element;

OTHERWISE starting a new group with said current element.

4. The apparatus of claim 3, where, in said group averager, $p_1$ equals 0.1.

5. The apparatus of claim 1, wherein said average fundamental selector further comprising means for determining whether any elements remain in said averaged groupings of fundamentals vector, $\vec{G}$;

IF no further elements remain, THEN assigning to said averaged groupings of fundamentals vector, $\vec{G}$, a single element equal to $f_{min}$, where $f_{min}$ is chosen value for which the positive elements of a vector D are greater than; assigning to said associated count vector, $\vec{C}$, a single element equal to a count threshold, $c_t$;

OTHERWISE resuming said processing of said vector G vector, $\vec{C}$.

6. The apparatus of claim 1, wherein said sub-harmonic searcher further comprises means for determining whether $0.5\alpha_0$ is greater than $f_{min}$;

IF $0.5\alpha_0$ is greater than $f_{min}$, THEN reducing $\alpha_0$ by a factor of 0.5;

OTHERWISE resuming producing a pre-refined fundamental estimate.

7. The apparatus of claim 1, wherein said fundamental refiner further comprising means for determining whether the minimum of the absolute values of the elements of said vector $\vec{E}$ is less than the minimum of the absolute values of the elements of said vector $\vec{E}_{-1}$ AND also less than x, where $$x=p_3 f_0(-1);$$

$p_3$ is a fractional parameter; and $f_0(-1)$ is the refined fundamental estimate from a previous signal segment;

IF the absolute values of the elements of said vector $\vec{E}$ is less than the minimum of the absolute values of the elements of said vector $\vec{E}_{-1}$ AND also less than x, THEN associating the element $f_0$ of said vector $\vec{F}$ with the minimum of the absolute values of the elements of said vector $\vec{E}$;

OTHERWISE setting $f_0=\phi_0$.

8. The apparatus of claim 1, wherein said harmonic refiner further comprises means for determining whether the minimum of the absolute values of the elements of said vector $\vec{E}$ is less than the minimum of the absolute values of the elements of said vector $\vec{E}_{-1}$, AND also less than x, where $$x=p_3 h_k(-1);$$

$p_3$ is a fractional parameter; and $h_k(-1)$ is the refined harmonic estimate from a previous signal segment;

IF the minimum of the absolute values of the elements of said vector $\vec{E}$ is less than the minimum of the absolute values of the elements of said vector $\vec{E}_{-1}$, AND also less than x, THEN associating element $h_k$ of said vector $\vec{F}$ with the minimum of the absolute values of the elements of said vector $\vec{E}$;

OTHERWISE setting $h_k = \phi_k$.

9. A computer implementable method for analyzing the harmonicity of periodic signals, said method comprises a software program having a plurality of computer executable instructions which, when executed, causes a computer to perform the steps comprising:

dividing said signal into consecutive segments;

calculating a super-resolution decomposition of said segments into frequency values, frequency decay rates, and initial amplitudes;

pruning said list of frequencies so as to produce a list vector of frequency values $\vec{L}$ having n elements;

ordering the elements of said list vector L so as to produce an ordered frequency list vector $\vec{F}$;

forming a matrix $\vec{F}$, having as each column said frequency list vector $\vec{F}$;

forming a matrix of candidate fundamentals D from said matrix F and said frequency list vector $\vec{F}$ according to $D=\vec{F}-F^T$;

forming a candidate fundamental list vector $\vec{D}$ whose m elements are chosen from the positive elements of D that are greater than a minimum value;

producing both a vector of averaged groupings of fundamentals, $\vec{G}$, and an associated count vector, $\vec{C}$, from said fundamental list vector $\vec{D}$;

processing said vector of averaged groupings of fundamentals, $\vec{G}$, and said associated count vector, $\vec{C}$ so as to produce a count threshold c and an initial fundamental estimate $\alpha_0$;

producing a pre-refined fundamental estimate, $\phi_0$, by computing a sub-harmonic candidate vector $\vec{S}$ from said initial fundamental estimate $\alpha_0$ and said frequency list vector $\vec{F}$ according to $\vec{S}=\vec{F}-0.5\alpha_0 1$;

producing a refined fundamental estimate, $f_0$, by computing a first error vector $\vec{E}_{-1}$, according to $\vec{E}_{-1}=\vec{F}-f_0(-1)\cdot\vec{1}$ and by computing a second error vector $\vec{E}$ according to $\vec{E}=\vec{F}-\phi_k\vec{1}$; and producing a refined harmonic estimate, $h_k$, by recomputing said first error vector $\vec{E}$, according to $\vec{E}_{-1}=\vec{F}-h_k(-1)\cdot\vec{1}$ and by recomputing said second error vector $\vec{E}$ according to $\phi_k=\vec{F}-\phi_k\vec{1}$, where $\phi_k = kf_0$, and where the integer k is greater than 1; and where $h_k(-1)$ is the refined harmonic estimate from the previous signal segment.

10. The computer implementable method of claim 9, wherein said step of forming a candidate fundamental list vector further comprises the step of choosing the positive elements of D that are greater than $f_{min}>0$; and arranging the elements of vector $\vec{D}$ ascending order so as to result in $m \leqq 0.5n^{2-0.5}n$.

11. The computer implementable method of claim 9, wherein said first step of producing both a vector of averaged groupings of fundamentals, $\vec{G}$, and an associated count vector, $\vec{C}$ further comprises the steps of inspecting the elements of said fundamental list vector $\vec{D}$;

beginning with the first element of said fundamental list vector $\vec{D}$, forming a difference between the current element and the previous element;

determining whether said difference is less than a fraction $p_1$ times the current element;

IF said difference is less than said fraction $p_1$ times said current element, THEN grouping said current element with said prior element;

OTHERWISE starting a new group with said current element.

12. The computer implementable method of claim 11 where, in said step of producing both a vector of averaged groupings of fundamentals, $\vec{G}$, and an associated count vector, $\vec{C}$, $p_1$ equals 0.1.

13. The computer implementable method of claim 9, wherein said step of processing said vector of averaged groupings of fundamentals, $\vec{G}$, and said associated count vector, $\vec{C}$ further comprises the steps of determining whether any elements remain in said averaged groupings of fundamentals vector, $\vec{G}$;

IF no further elements remain, THEN assigning to said averaged groupings of fundamentals vector, $\vec{G}$, a single element equal to $f_{min}$, where $f_{min}$ is a chosen value for which the positive elements of a vector D are greater than; assigning to said associated count vector, $\vec{C}$, a single element equal to a count threshold, $c_t$;

OTHERWISE resuming said processing of said vector G vector, $\vec{C}$.

14. The computer implementable method of claim 9, wherein said step of producing a pre-refined fundamental estimate $\phi_0$ further comprises the steps of determining whether $0.5\alpha_0$ is greater than $f_{min}$;

IF $0.5\alpha_0$ is greater than $f_{min}$, THEN reducing $\alpha_0$ by a factor of 0.5;

OTHERWISE resuming producing a pre-refined fundamental estimate.

15. The computer implementable method of claim 9, wherein said step of producing a refined fundamental estimate $f_0$ further comprises the steps of determining whether the minimum of the absolute values of the elements of said vector $\vec{E}$ is less than the minimum of the absolute values of the elements of said vector $\vec{E}_{-1}$, AND also less than x, where $x=p_3 f_0(-1)$;

$p_3$ is a fractional parameter; and $h_k(-1)$ is the refined fundamental estimate from a previous signal segment;

IF the absolute values of the elements of said vector $\vec{E}$ is less than the minimum of the absolute values of the elements of said vector $\vec{E}_{-1}$ AND also less than x, THEN associating the element $f_0$ of said vector $\vec{F}$ with the minimum of the absolute values of the elements of said vector $\vec{E}$;

OTHERWISE setting $f_0=\phi_0$.

16. The computer implementable method of claim 9, wherein said step of producing a refined harmonic estimate, $h_k$ further comprises the steps of:

determining whether the minimum of the absolute values of the elements of said vector $\vec{E}$ is less than the minimum of the absolute values of the elements of said vector $\vec{E}_{-1}$, AND also less than x, where $x=p_3 f_0(-1)$;

$p_3$ is a fractional parameter; and $h_k(-1)$ is the refined fundamental estimate from a previous signal segment;

IF the absolute values of the elements of said vector $\vec{E}$ is less than the minimum of the absolute values of the elements of said vector $\vec{E}_{-1}$ AND also less than x, THEN associating the element $h_k$ of said vector F with the minimum of the absolute values of the elements of said vector $\vec{E}$;

OTHERWISE setting $h_k=\phi_k$.

* * * * *